United States Patent [19]

Komine et al.

[11] 4,174,222

[45] Nov. 13, 1979

[54] POSITIVE-TYPE O-QUINONE DIAZIDE CONTAINING PHOTORESIST COMPOSITIONS

[75] Inventors: Takashi Komine, Yokohama; Akira Yokota, Yamato; Hisashi Nakane, Kawasaki; Shingo Asaumi, Fujisawa; Noboru Okazaki, Chigasaki, all of Japan

[73] Assignee: Tokyo Ohka Kogyo Kabushiki Kaisha, Kawasaki, Japan

[21] Appl. No.: 881,260

[22] Filed: Feb. 27, 1978

Related U.S. Application Data

[63] Continuation-in-part of Ser. No. 660,432, Feb. 23, 1976, abandoned.

[30] Foreign Application Priority Data

May 24, 1975 [JP] Japan ................................. 50/62412

[51] Int. Cl.$^2$ ............................ G03C 1/54; C03C 1/70
[52] U.S. Cl. ................................. 430/190; 260/141; 430/302; 430/318; 430/270
[58] Field of Search .................. 96/91 D, 75, 33, 36.2, 96/36, 115 R; 260/141 D

[56] References Cited

U.S. PATENT DOCUMENTS

| | | | |
|---|---|---|---|
| 3,061,430 | 10/1962 | Uhlig et al. .............................. 96/33 |
| 3,106,465 | 10/1963 | Neugebauer et al. ................ 96/91 D |
| 3,130,047 | 4/1964 | Uhlig et al. ........................... 96/91 D |
| 3,130,048 | 4/1964 | Fritz et al. ............................. 96/91 D |
| 3,148,983 | 9/1964 | Endermann et al. .................... 96/33 |
| 3,201,239 | 8/1965 | Neugebauer et al. ................... 96/36 |
| 3,402,044 | 9/1968 | Steinhoff et al. ......................... 96/75 |
| 3,635,709 | 1/1972 | Kobayashi ........................... 96/91 D |
| 3,666,473 | 5/1972 | Colom et al. ........................ 96/91 D |

FOREIGN PATENT DOCUMENTS

| | | | |
|---|---|---|---|
| 942564 | 11/1963 | United Kingdom .................... 96/91 D |
| 1053866 | 1/1967 | United Kingdom .................... 96/91 D |

OTHER PUBLICATIONS

Chem. Abstracts, vol. 68, 1968, 55365g.
Chem. Abstracts, vol. 75, 1971, 43144r.

*Primary Examiner*—Charles L. Bowers, Jr.
*Attorney, Agent, or Firm*—Brisebois & Kruger

[57] ABSTRACT

A gallic acid alkyl ester or a gallic acid aryl ester is reacted in an inert solvent with 3 equivalents of naphthoquinone-(1,2)-diazido-(2)-sulfonyl chloride in the presence of an alkali to effect sulfonylation of 3 hydroxyl groups in the gallic acid moiety whereby a photodecomposable naphthoquinone-(1,2)-diazido-(2)-sulfonic acid ester is obtained. The new naphthoquinonediazido derivative thus obtained is mixed with an alkali-soluble phenol resin such as m-cresol novolac resin or phenol novolac resin to prepare a positive-type photoresist composition having high sensitivity and high resolving power as well as excellent dimensional accuracy and etching-resistance. In addition, this composition forms a good photosensitive film and can be a good ink receptor.

8 Claims, 2 Drawing Figures

POSITIVE-TYPE O-QUINONE DIAZIDE CONTAINING PHOTORESIST COMPOSITIONS

BACKGROUND OF THE INVENTION

This is a continuation-in-part application of a parent application with the Ser. No. 660,432 filed Feb. 23, 1976, now abandoned.

The present invention relates to a positive-type photoresist composition. More particularly, the present invention relates to a new positive-type photoresist composition which comprises as the essential ingredient a combination of an alkali-soluble phenol resin and a naphthoquinone-(1,2)-diazido-(2)-sulfonic acid ester.

Known hitherto as a positive-type photoresist composition are a condensate of a quinonediazido compound and an alkali-soluble phenol novolac resin and a composition comprising as a photocurable ingredient a mixture of a quinonediazido ester and an alkali-soluble phenol novolac resin. As photoresists for manufacturing a photosensitive film which functions also as an ink receptor for positive-type offset printing plates in the field of graphic art and for manufacturing electronic parts such as printed circuit boards, IC and LSI, a naphthoquinonediazido compound is mainly used as quinone diazide component because of its high sensitivity.

In recent years, however, the utilizable extent of the positive-type photoresists in electronic industries becomes broader and a higher level of resolving power, sensitivity and dimensional accuracy is required for the phtoresists. In the case of offset printing plates, positive-type photoresists having high sensitivity and excellent development stability are demanded to enable treatments of a great number of materials within a short period of time. In the prior art positive-type photoresist compositions, however, increase in the amount of a quinonediazido compound for improving stability by minimizing changes in unexposed areas of the film during developing treatments incurs lowering of sensitivity. On the other hand, decrease in the amount of a quinonediazido compound for enhancing sensitivity permits significant changes in unexposed areas of the film during developing treatments to make the product impractical. Especially in the case of the use of a compound having a low diazido content, a large amount of the compound should be incorporated into the photoresist composition to enhance sensitivity. However, incorporation of such a large amount of the compound permits undesirable lowering of the content of a base resin and inevitably incurs undesirable phenomena such as reduction of adhesion force and resolving power of the photoresist and precipitation of the diazido compound. In the above mentioned various fields of industry, therefore, there is a great demand for the development of a new positive-type photoresist composition which is improved in sensitivity and stability and shows no reduction of adhesion force and resolving power.

As a result of various researches made to improve the useful properties of the prior art positive-type photoresists, it has now been found that the aforementioned drawbacks of the prior art positive-type photoresist compositions can be overcome by incorporating an alkali-soluble phenol resin with a specific naphthoquinone-(1,2)-diazido-(2)-sulfonic acid ester. The present invention has been accomplished on the basis of the above finding.

BRIEF SUMMARY OF THE INVENTION

The present invention is directed to a new positive-type photoresist composition which comprises an alkali-soluble phenol resin and a compound obtained by sulfonylation of the three hydroxyl groups in a gallic acid ester with naphthoquinone-(1,2)-diazido-(2)-sulfonyl chloride.

It is an object of the present invention to provide a new positive-type photoresist composition which exhibits high resolving power, high sensitivity and high dimensional accuracy in the manufacture of electronic parts by etching treatments.

It is another object of the present invention to provide a positive-type photoresist composition which is excellent in etching resistance.

It is a further object of the present invention to provide a positive-type photoresist composition which has high sensitivity and is excellent in development stability.

Other and further objects, features and advantages of the present invention will appear more fully from the following descriptions.

DETAILED DESCRIPTION OF THE INVENTION

Figure 1:
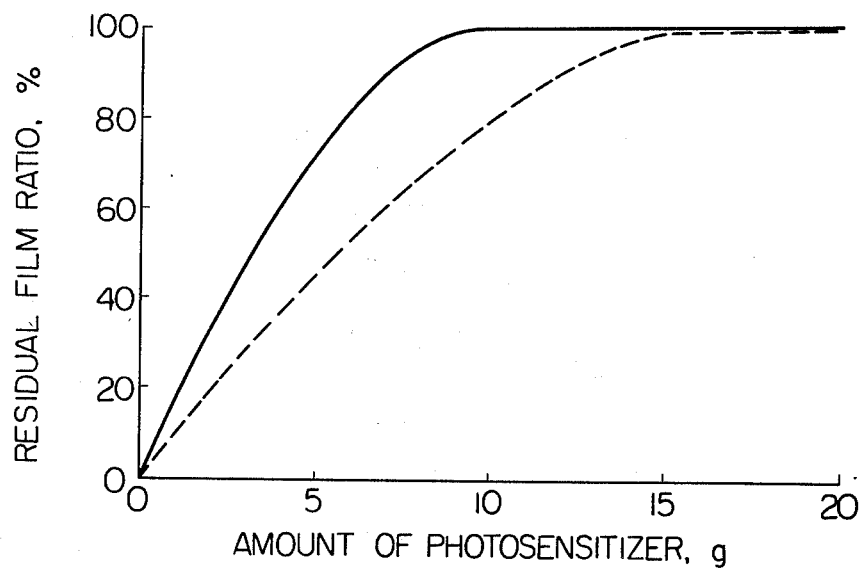
FIG. 1 is a graphic showing of the relationship between the amount of the photosensitizer and the residual film ratio in Example 7.

In accordance with the present invention, there is provided a positive-type photoresist composition which comprises as the essential ingredient a combination of an alkali-soluble phenol resin and a compound of the general formula:

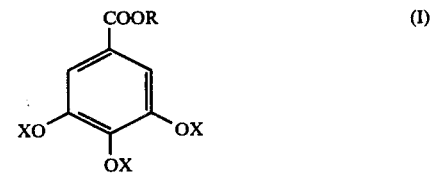

wherein R stands for an aryl group, a substituted aryl group or an alkly group and X for a naphthoquinone-(1,2)-diazido-(2)-sulfonyl residue such as naphthoquinone-(1,2)-diazido-(2)-4-sulfonyl residue or naphthoquinone-(1,2)-diazido-(2)-5-sulfonyl residue.

Examples of the alkali-soluble phenol resin utilizable for the present invention include m-cresol novolac resins such as Sumilite resin (a tradename of the resin manufactured by Sumitomo Bakelite Co., Japan) and Alnovol K (a tradename of the resin manufactured by Kalle AG., West Germany) and phenol novolac resins such as Nikkalite (a tradename of the product manufactured by Nippon Synthetic Chemical Industry Co., Japan) and PR resin (a tradename of the product manufactured by Sumitomo Bakelite Co., Japan). Other novolac resins can also be used for the present invention as far as they are soluble in an aqueous alkali solution.

On the other hand, examples of the naphtoquinone-(1,2)-diazido-(2)-sulfonic acid esters of the general formula (I) include those wherein R stands for an alkyl group such as ethyl, propyl, butyl, isobutyl, amyl or isoamyl group or an aryl or substituted aryl group such as phenyl, naphthyl, tolyl, xylyl, α-methylnaphtyl, methoxyphenyl, ethoxyphenyl, acetylphenyl, acetylnaphthyl, hydroxyphenyl or hydroxynaphthyl group.

These naphthoquinonediazido derivatives of the general formula (I) are obtained, for example, by subjecting one mole of a gallic acid ester of the general formula:

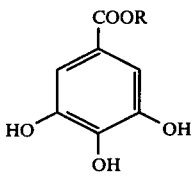 (II)

wherein R has the same meaning as given above, and 3 moles of naphthoquinone-(1,2)-diazido-(2)-sulfonyl chloride to a condensation reaction conducted in an inert solvent in the presence of an alkali. Preferable examples of the alkali used in this case include sodium carbonate and sodium bicarbonate.

In general, quinonediazido compounds are sparingly soluble in organic solvents. However, the naphthoquinonediazido derivatives of the general formula (I) have such a technical advantage that they are easily soluble in organic solvents in spite of their high diazido content. These compounds have an additional advantage that, since addition of the compounds even in a small amount attains a satisfactory effect, they can be used without sacrificing the beneficial properties of the alkali-soluble phenol novolac resins.

In the composition of the present invention, the naphthoquinonediazido derivative of the general formula (I) and the alkali-soluble phenol novolac resin are usually mixed in a ratio by weight of 1:1 to 1:10 or, preferably 1:6 to 1:10. A larger proportion of the alkali-soluble phenol novolac resin, for example, 50 parts by weight of the resin per part by weight of the naphthoquinonediazido derivative may be used according to the purpose, for example, for enhancing the etching-resistance. On the other hand, the amount of the naphthoquinonediazido derivative as a photodecomposable substance may be increased when satisfactory dimensional stability is required in development. This photodecomposable substance is insoluble in an alkaline developer solution when not exposed to light.

In addition to the above mentioned essential ingredient, the composition of the present invention may be admixed, if desired, with various additives conventionally used in photoresist compositions of this type, such as dyes and thermal stabilizers.

The composition of the present invention is employed usually as a solution in a suitable organic solvent. Illustrative of the organic solvent are, for example, ethers such as ethyleneglycol monoethyl ether acetate (ethylcellosolve acetate), glycol monomethyl ether and glycol monoethyl ether; aliphatic esters such as butyl acetate; aliphatic ketones such as acetone and methyl isobutyl ketone; cyclic ethers such as dioxane and a mixture of these solvents.

The composition of the present invention affords a photoresist of excellent quality and so is widely utilizable for the manufacture of IC, ultra LSI of high quality. In case the composition of the present invention is used for a photoresist, an aqueous solution containing sodium hydrogen phosphate and sodium metasilicate or an aqueous solution of tetramethylammonium hydroxide can advantageously be used as a developer solution.

The present invention will now be explained in more detail by way of examples and a referential example. However, these examples and referential example are given only for the purpose of illustration and are not construed to limit the scope of the invention.

REFERENTIAL EXAMPLE 13.4 Grams of isoamyl gallate and 45 g of naphthoquinone-(1,2)-diazido-(2)5-sulfonyl chloride were dissolved in dioxane in an amount to prepare an about 10% solution. To this solution was slowly added dropwise under vigorous agitation 80 ml of an about 10% aqueous solution of sodium carbonate. The mixture was further reacted for one hour at room temperature. To the mixture were then added 100 ml of 15% hydrochloric acid and 400 ml of water whereby a yellowish product was precipitated. The mother liquor was removed by siphoning and the precipitate was washed with water and then collected by filtration. The resulting product was dissolved in 1 liter of a mixed solvent (1:1 in volume ratio) of ethylcellosolve acetate and butyl acetate. An equal volume of 1% hydrochloric acid was then added to the solution and the mixture was stirred to eliminate by-products. The mixture was allowed to stand and the oily phase obtained by removing water and dioxane was dissolved in ethylcellosolve acetate to give a solution of isoamyl 3,4,5-tris [naphthoquinone-(1,2)-diazido-(2)-5-sulfonyloxy] benzoate. This solution was used as such in the subsequent step.

Various kinds of naphthoquinone-(1,2)-diazido-(2)-sulfonic acid ester derivatives can be prepared in a similar manner by use of different kinds of the gallic acid ester and at least stoichiometric amount of naphthoquinone-(1,2)-diazido-(2)-sulfonyl chloride.

Below are the compounds obtained in this manner, in which substituents are shown by way of the notations used in the general formula (I).

| | | |
|---|---|---|
| (1) Derivatives wherein R stands for an alkyl group: | | |
| Compound (a): | R = isoamyl group, | |
| | X = naphthoquinone-(1,2)-diazido-(2)-5-sulfonyl group | |
| Compound (b): | R = n-propyl group, | |
| | X = naphthoquinone-(1,2)-diazido-(2)-5-sulfonyl group | |
| Compound (c): | R = ethyl group, | |
| | X = naphthoquinone-(1,2)-diazido-(2)-5-sulfonyl group | |
| (2) Derivatives wherein R stands for an aryl group or a substituted aryl group: | | |
| Compound (d): | R = 4-methylphenyl group, | |
| | X = naphthoquinone-(1,2)-diazido-(2)-5-sulfonyl group | |
| Compound (e): | R = phenyl group | |
| | X = naphthoquinone-(1,2)-diazido-(2)-5-sulfonyl group | |
| Compound (f): | R = 2,4-dimethylphenyl group, | |
| | X = naphthoquinone-(1,2)-diazido-(2)-5-sulfonyl group | |
| Compound (g): | R = 4-methoxyphenyl group, | |
| | X = naphthoquinone-(1,2)-diazido-(2)-5-sulfonyl group | |
| Compound (h): | R = naphthyl-(1) group, | |
| | X = naphthoquinone-(1,2)-diazido-(2)-sulfonyl group | |

EXAMPLE 1

A coating solution was prepared by dissolving 2.5 g of the compound (a) obtained in the Referential Example above and 10 g of a m-cresol novolac resin, Alnovol K, supplied by Kalle AG., in a mixed solvent of 80 g of ethylcellosolve acetate, 10 g of butyl acetate and 10 g of xylene followed by filtration. The coating solution thus prepared was applied by means of a spinner rotating at 3000 r.p.m. on to a silicon wafer substrate plated with chromium by vacuum evaporation to form a coating film of 1 μm thickness as dried and dried with hot air at 80° to 85° C.

The silicon wafer coated with the photosensitive composition was exposed to light emitted from an ultra-high pressure mercury lamp through a negative mask until the coating film turned yellow on the exposed areas and subjected to development with a diluted aqueous alkaline solution containing sodium metasilicate and sodium hydrogenphosphate as a developer solution at 23±1° C. for about 1 minute followed by thorough washing with water. Without subjecting a post-baking, the chromium layer was etched with a mixed etching solution containing perchloric acid and cerium (IV) ammonium nitrate to give etched images with a resolving power and dimensional accuracy as high as in the original mask itself indicating the high etching resistance of the coating film.

An equally satisfactory result was obtained with a 2.5% aqueous solution of tetramethylammonium hydroxide was used as the developer solution instead of the solution containing sodium metasilicate and sodium hydrogenphosphate.

EXAMPLE 2

The same experimental procedure as in Example 1 was repeated except that 2 g of the compound (f) obtained in the Referential Example was used instead of the compound (a). The results were as satisfactory as in Example 1.

EXAMPLE 3

A positive type plate for offset printing was obtained by uniformly coating an aluminum plate of 0.3 mm thickness with the surface roughened by anodic oxidation by dipping in a solution prepared by dissolving 2 g of the compound (a) obtained in the Referential Example in 100 ml of ethylcellosolve acetate followed by filtration and dried with hot air at 80° to 85° C. for about 10 minutes to give a dried coating film of about 2 μm thickness.

The plate was then exposed to light through a positive transparency overlaid on the surface in close contact with vacuum and developed with an alkaline developer solution of pH 12.8 containing sodium metasilicate and sodium hydrogenphosphate taking care to avoid any influence to the aluminum surface to give images with high fidelity. Subsequent washing with water and application of gum arabic on to the surface gave an offset printing plate with well balanced receptivity of printing ink on the resist and wettability with water on the bare aluminum surface.

EXAMPLE 4

A polished zinc plate for high-speed etching was coated by means of a spinner in a coating amount of about 3 μm thickness as dried with a coating solution prepared by dissolving 2.5 g of the compound (f) obtained in the Referential Example and 10 g of PR Resin, supplied by Sumitomo Bakelite Co., in a mixed solvent of 80 g of ethylcellosolve acetate, 10 g of isoamyl acetate and 10 g of toluene followed by filtration with subsequent drying at 80° C. The thus coated plate was exposed to light through a positive transparency and developed with the same developer solution as in Example 3 for about 1 minute. Extension of the time of development to 10 minutes or longer caused no reduction in the film thickness on the unexposed areas showing high stability of the coating film in development. The plate was subjected to high-speed etching to give a relief depth of about 0.7 mm without post-baking. Thus a letter-press printing plate of high quality was obtained without influencing the resist portion.

EXAMPLE 5

The same experimental procedure as in Example 4 was repeated with a copper plate for printing use instead of the zinc plate and, correspondingly, with an aqueous solution of iron (III) chloride of 35° Be as the etching solution. The resultant letter-press printing plate was as satisfactory as in Example 4.

EXAMPLE 6

Dissolution of 10 g of the compound (a) obtained in the Referential Example and 40 g of a m-cresol novolac resin, Sumilite Resin, supplied by Sumitomo Bakelite Co., in a mixed solvent of 80 g of ethylcellosolve acetate, 10 g of butyl acetate and 10 g of xylene gave a clear, homogeneous solution, which is referred to as the Composition A hereinafter.

Instead of the compound (a) above, equal amount of 2,3,4-tris[naphthoquinone-(1,2)-diazido-(2)-5-sulfonyloxy] isoamyl benzoate was used but no clear solution was obtained with about 15% of the solid matter remaining undissolved.

The above experiments clearly demonstrate that the compounds proposed in this invention as the photosensitizer have high solubility in organic solvents in comparison with a similar compound having a naphthoquinone-(1,2)-diazido-(2)-5-sulfonyloxy group at the ortho position to the carboxyl group.

EXAMPLE 7

Coating solutions were prepared by dissolving 40 g of a m-cresol novolac resin, Sumilite Resin, supplied by Sumitomo Bakelite Co., and varied amounts of the compound (a) obtained in the Referential Example each in a mixed solvent of 80 g of ethylcellosolve acetate, 10 g of butyl acetate and 10 g of xylene and a substrate plate with thermally evaporated aluminum film was coated with the thus prepared coating solution by means of a spinner rotating at about 5000 r.p.m. to give a coating film of 1.6 μm thickness followed by pre-baking at 85° C. for 20 minutes. The plates bearing the photoresist layer thus provided were dipped in a 2.4% aqueous solution of tetramethylammonium hydroxide for 1 minute and the percentages of the film thickness after dipping or development to the thickness as pre-baked (referred to as residual film ratio hereinafter) were obtained. The solid curve in FIG. 1 is a plot indicating the relationship between the amount of the compound (a) as the photosensitizer and the residual film ratio as defined above.

For comparison, similar experiments were repeated with 2-hydroxy-3,4-bis[naphthoquinone-(1,2)-diazido-(2)-5-sulfonyloxy] isoamyl benzoate in place of the compound (a) and the results are shown by the dotted curve in FIG. 1.

As is understood from FIG. 1, the minimum amount of the compound (a) in the photoresist composition of the present invention required to exhibit sufficient effect is about two thirds of the amount requird for a conventional photosensitizer of the similar chemical structure.

EXAMPLE 8

A comparative measurement of the photosensitivity was carried out with the Composition A prepared in Example 6 and a Composition B prepared in the same manner as the Composition A with 2-hydroxy-3,4-bis[-naphthoquinone-(1,2)-diazido-(2)-5-sulfonyloxy] isoamyl benzoate instead of the compound (a) according to the following procedure.

Silicon wafers with thermally evaporated aluminum film were coated with each of the Compositions in a coating amount of 1.6 μm as dried by means of a spinner rotating at about 5000 r.p.m. and pre-baked at 85° C. for 20 minutes.

Figure 2:
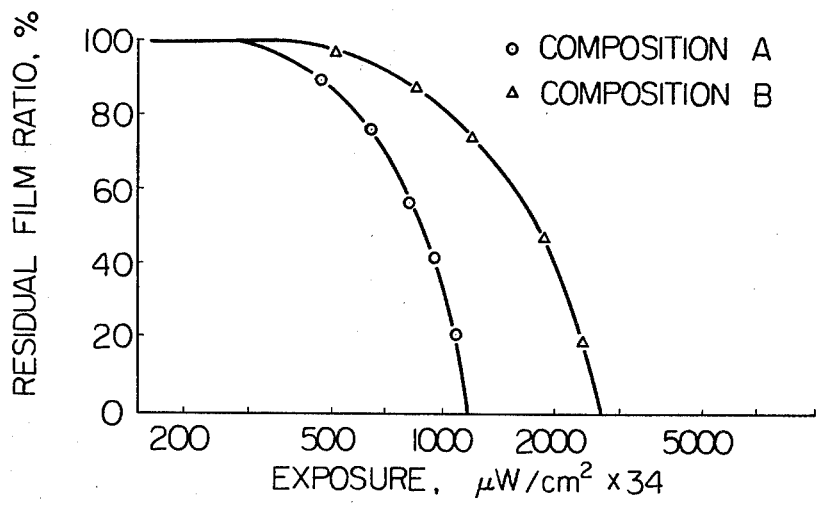
FIG. 2 is a graphic showing of the relationship between the exposure dose to light and the residual film ratio in Example 8.

Then thus prepared silicon wafers were exposed to light from a 200-watt ultra-high pressure mercury lamp with masking by a chromium-step tablet and developed by dipping in a 2.4% aqueous solution of tetramethylammonium hydroxide at 23° C. for 1 minute. The relationship between the exposure dose and the residual film ratio is plotted in FIG. 2. As is understood from FIG. 2, the photoresist composition of the present invention with the compound (a) has a photosensitivity about twice as high as the similar composition with a conventional photosensitizer of the similar chemical structure having a hydroxy group at the ortho position to the carboxyl group when used in a minimum practical amounts.

What is claimed is:

1. A positive-type photoresist composition which comprises as essential ingredients an alkali-soluble phenolic novolac resin in an amount sufficient to give etching resistance to the composition and at least one naphthoquinonediazido derivative of the general formula

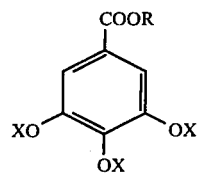

in an amount sufficient to make the composition photodecomposable wherein R stands for a substituent selected from the group consisting of alkyl, aryl and nucleus-substituted aryl groups and X stands for a naphthoquinone-(1,2)-diazido-(2)-sulfonyl residue.

2. The positive-type photoresist composition as claimed in claim 1 wherein R in the general formula is selected from the group consisting of alkyl groups having 2-5 carbon atoms, phenyl group, nucleus-substituted phenyl groups, nephthyl group and nucleus-substituted naphthyl groups.

3. The positive-type photoresist composition as claimed in claim 2 wherein R in the general formula is selected from the group consisting of ethyl, propyl, n-butyl, isobutyl, amyl, isoamyl, phenyl, naphthyl, tolyl, xylyl, α-methylnaphthyl, methoxyphenyl, ethoxyphenyl, acetylphenyl, hydroxyphenyl and hydroxynaphthyl groups.

4. The positive-type photoresist composition as claimed in claim 1 wherein the naphthoquinone-(1,2)-diazido-(2)-sulfonyl residue is naphthoquinone-(1,2)-diazido-(2)-4-sulfonyl residue or naphthoquinone-(1,2)-diazido-(1,2)-5-sulfonyl residue.

5. The positive-type photoresist composition as claimed in claim 1 wherein the alkali-soluble phenolic novolac resin is a m-cresol novolac resin or a phenol novolac resin.

6. The positive-type photoresist composition as claimed in claim 1 wherein the ratio by weight of the alkali-soluble phenolic novolac resin to the naphthoquinonediazido derivative is in the range from about 1:1 to 10:1.

7. The positive-type photoresist composition as claimed in claim 1 which additionally comprises a dye or a thermal stabilizer.

8. The composition as set forth in claim 1 wherein X is naphthoquinone-(1,2)-diazido-(2)-5-sulfonyl.

* * * * *